United States Patent
Asai et al.

(10) Patent No.: US 9,773,562 B2
(45) Date of Patent: Sep. 26, 2017

(54) STORAGE APPARATUS, FLASH MEMORY CONTROL APPARATUS, AND PROGRAM

(71) Applicant: DENSO CORPORATION, Kariya, Aichi-pref. (JP)

(72) Inventors: Takeshi Asai, Kariya (JP); Nobuya Uematsu, Kariya (JP); Tsuneo Yamamoto, Kariya (JP); Yasushi Kanda, Kariya (JP)

(73) Assignee: DENSO CORPORATION, Kariya, Aichi-pref (JP)

( * ) Notice: Subject to any disclaimer, the term of this patent is extended or adjusted under 35 U.S.C. 154(b) by 0 days.

(21) Appl. No.: 15/314,573

(22) PCT Filed: May 29, 2015

(86) PCT No.: PCT/JP2015/002719
§ 371 (c)(1),
(2) Date: Nov. 29, 2016

(87) PCT Pub. No.: WO2015/194100
PCT Pub. Date: Dec. 23, 2015

(65) Prior Publication Data
US 2017/0200503 A1     Jul. 13, 2017

(30) Foreign Application Priority Data

Jun. 19, 2014 (JP) ................................ 2014-126658

(51) Int. Cl.
*G11C 16/10*     (2006.01)
*G11C 16/16*     (2006.01)
(Continued)

(52) U.S. Cl.
CPC .............. *G11C 16/16* (2013.01); *G06F 12/02* (2013.01); *G11C 16/26* (2013.01)

(58) Field of Classification Search
CPC ................................. G11C 16/10; G06F 12/02
(Continued)

(56) References Cited

U.S. PATENT DOCUMENTS 7,558,904 B2 * 7/2009 Nakajima ........... G06F 11/1435
    711/103
9,298,240 B2 * 3/2016 Zettsu ..................... G06F 12/02
(Continued)

FOREIGN PATENT DOCUMENTS

JP        5162846 B2     3/2013

*Primary Examiner* — Son Mai
(74) *Attorney, Agent, or Firm* — Harness, Dickey & Pierce, P.L.C.

(57) ABSTRACT

A storage apparatus includes a flash memory that includes multiple blocks; and a control portion that reads data written in the block and writes the data into the block. The flash memory includes one block set having n pieces of the blocks including $BR_1$ to $BR_n$. A write data and a write flag are capable of being written into each of blocks $BR_j$, the write data being written in accordance with a request, the write flag indicating that the write data has been written into a target block $BR_j$. In accordance with a write request, the control portion performs an erasure process, a first write process, and a second write process. The erasure process erases the data including the write data and the write flag. The first write process writes the new write data into the block $BR_j$. The second write process writes the write flag into a block $BR_m$.

6 Claims, 9 Drawing Sheets

(51) Int. Cl.
*G11C 16/26* (2006.01)
*G06F 12/02* (2006.01)

(58) Field of Classification Search
USPC .................................................... 365/185.33
See application file for complete search history.

(56) References Cited

U.S. PATENT DOCUMENTS

| | | | | |
|---|---|---|---|---|
| 2002/0069313 | A1* | 6/2002 | Douniwa | G06F 11/1435 |
| | | | | 711/102 |
| 2005/0201177 | A1* | 9/2005 | Shiraishi | G11C 16/105 |
| | | | | 365/222 |
| 2005/0219904 | A1* | 10/2005 | Sakurai | G11C 16/225 |
| | | | | 365/185.18 |
| 2007/0028035 | A1 | 2/2007 | Nishihara | |
| 2007/0133291 | A1* | 6/2007 | Fukuda | G11C 16/0483 |
| | | | | 365/185.17 |
| 2008/0098161 | A1* | 4/2008 | Ito | G06F 3/0611 |
| | | | | 711/103 |
| 2016/0034226 | A1* | 2/2016 | Nakaso | G06F 11/1441 |
| | | | | 714/6.11 |

\* cited by examiner

FIG. 9

| STATE NUMBER | COMBINATION ||| OCCURRENCE PROBABILITY | VALID BLOCK | DATA RECOVERY PROCEDURE |
| --- | --- | --- | --- | --- | --- | --- |
| | BR1 | BR2 | BR3 | | | |
| 1 | F | F | — | NORMAL STATE | BR3 | UNREQUIRED |
| 2 | F | F | M | REWRITE INTERRUPTED | BR3 | REWRITE BLOCK BR1 DATA WITH BLOCK BR3 DATA |
| 3 | M | F | M | REWRITE INTERRUPTED | BR3 | |
| 4 | — | F | M | REWRITE INTERRUPTED | BR3 | |
| 5 | — | F | F | NORMAL STATE | BR1 | UNREQUIRED |
| 6 | M | F | F | REWRITE INTERRUPTED | BR1 | REWRITE BLOCK BR2 DATA WITH BLOCK BR1 DATA |
| 7 | M | M | F | REWRITE INTERRUPTED | BR1 | |
| 8 | M | — | F | REWRITE INTERRUPTED | BR1 | |
| 9 | F | — | F | NORMAL STATE | BR2 | UNREQUIRED |
| 10 | F | M | F | REWRITE INTERRUPTED | BR2 | REWRITE BLOCK BR3 DATA WITH BLOCK BR2 DATA |
| 11 | F | M | M | REWRITE INTERRUPTED | BR2 | |
| 12 | F | M | — | REWRITE INTERRUPTED | BR2 | |

STORAGE APPARATUS, FLASH MEMORY CONTROL APPARATUS, AND PROGRAM

CROSS REFERENCE TO RELATED APPLICATIONS

This application is a U.S. National Phase Application under 35 U.S.C. 371of International Application No. PCT/JP2015/002719 filed on May 29, 2015 and published in Japanese as WO 2015/194100 A1 on Dec. 23, 2015. This application is based on and claims the benefit of priority from Japanese Patent Application No. 2014-126658 filed on Jun. 19, 2014. The entire disclosures of all of the above applications are incorporated herein by reference.

TECHNICAL FIELD

The present disclosure relates to storage apparatus having a flash memory.

BACKGROUND ART

A flash memory is recently used in communication instruments, AV (audio visual) instruments, and other instruments in various fields. Data in a flash memory is erased in units of a block, which is a group of multiple memory cells. In some cases, therefore, a write unit size and an erasure unit size may differ from each other. For example, a write is performed in units of a block having several bytes while an erasure is performed in units of a block having several tens of bytes to several kilobytes.

Due to a characteristic that a flash memory cannot be overwritten, data is additionally written into a block in a sequential manner for data management purposes. As such being the case, when, for instance, a block is filled as a result of repeated additional write into the block, an unoccupied block (an empty block) is prepared by erasing data from a block other than the filled block for the purpose of copying valid data (this process will be hereinafter referred to as the reorganization process).

During execution of the reorganization process, a data erasure process and a copy process are intensively performed with respect to blocks. A processing load on the entire storage system having a flash memory may increase. Thus, access to data during the reorganization process is likely to be blocked.

Storage apparatus previously proposed, for instance, in Patent Literature 1 performs the reorganization process in a standby state in which no access is made. When data is accessed during the reorganization process, the storage apparatus interrupts the reorganization process, and then resumes the reorganization process upon termination of access. In this manner, the storage apparatus reduces the possibility of access to data being blocked during the reorganization process.

The inventors of the present application have found the following. The storage apparatus proposed in Patent Literature 1 needs to perform the reorganization process itself. Therefore, when a period of time when processing load increases due to the reorganization process gets longer, overall system performance may deteriorate.

PRIOR ART LITERATURE

Patent Literature

Patent Literature 1: JP 5162846 B2

SUMMARY OF INVENTION

It is an object of the present disclosure to provide storage apparatus, flash memory control apparatus, and a program that are capable of suppressing an increase in processing load.

According to one aspect of the present disclosure, a storage apparatus includes: a flash memory that includes a plurality of blocks, an erasure of a data being performed in units of a block, a writing of a data being performed in units smaller than the block; and a control portion that reads the data written in the block and writes the data into the block.

The flash memory in the storage apparatus includes at least one block set having n pieces of the blocks including $BR_1$ to $BR_n$ (n is an integer of 2 or more).

A write data and a write flag are capable of being written into each of blocks $BR_i$ included in the block set (i is an integer of 1 to n). The write data is written in accordance with a request from a host apparatus. The write flag indicates that the write data has been written into a target block $BR_j$ that is pre-assigned to each of the blocks $BR_i$ of the block set, (j is an integer of 1 to n and other than i and varies with respect to a value of i).

In accordance with a write request of a new write data from the host apparatus, the control portion performs an erasure process, a first write process, and a second write process. The erasure process erases the data including the write data and the write flag written in a block $BR_l$ (l is an integer of 1 to n), the block $BR_l$ being set as the block into which a write data is to be written subsequently to a block $BR_k$ (k is an integer of 1 to n), the block $BR_k$ being the block in which the write data has been written latest among the blocks included in the block set. The first write process writes the new write data into the block $BR_l$. The second write process writes the write flag into a block $BR_m$ for which the block $BR_l$ is assigned as the target block.

Upon receipt of a write request from the host apparatus, the storage apparatus erases data written in a block in a block set that has been written earliest, and then writes new write data into the block.

Which block is to be erased or written into can be confirmed by checking a write flag of each block, which is a constituent of a block set. The reason is that conditions under which write flags are written in the block set change depending on which block was last written into.

Consequently, the storage apparatus does not require a copy process that is to be performed during a reorganization process. It may be possible to suppress a processing load increase due to the reorganization process, that is, suppress the occurrence of overhead. It may be possible to suppress degradation in overall system performance and delay in response to data access, which are caused by the occurrence of overhead.

According to another aspect of the present disclosure, a flash memory control apparatus includes: a control portion that reads a data written in and writes a data into a block of a plurality of blocks included in a flash memory, an erasure of the data being performed in units of a block, a writing of the data being performed in units smaller than the block; and a setup portion that includes at least one block set having n pieces of the blocks $BR_1$ to $BR_n$ included in the flash memory (n is an integer of 2 or more).

The control portion performs a first write process and a second write process. The first write process writes a write data that is to be written into a block $BR_i$ included in the block set in accordance with a request from a host apparatus (i is an integer of 1 to n). The second write process writes a write flag in order to indicate to the block $BR_i$ that a writing of the write data has been performed in a target block $BR_j$ that is pre-assigned to the block $BR_i$ included in the block set (j is an integer of 1 to n and other than i and varies with a value of i).

In accordance with a write request of a new write data from the host apparatus, the control portion performs an erasure process, the first write process, and the second write process. The erasure process erases the data including the write data and the write flag written in a block $BR_l$ (l is an integer of 1 to n), the block $BR_l$ being set as a block into which the write data is to be written subsequently to a block $BR_k$ (k is an integer of 1 to n), the block $BR_k$ being a block in which the write data has been written latest among the blocks included in the block set. The first write process is performed with respect to the block $BR_l$. The second write process is performed with respect to a block $BR_m$ for which the block $BR_l$ is assigned as the target block.

As is the case with the storage apparatus, the flash memory control apparatus does not require a copy process that is to be performed during a reorganization process. It may be possible to suppress a processing load increase due to the reorganization process, that is, suppress the occurrence of overhead. Thus, it may be possible to suppress degradation in overall system performance and delay in response to data access, which are caused by the occurrence of overhead.

According to another aspect of the present disclosure, there is provided a program that enables a computer to function as a control portion and setup portion for the flash memory control apparatus.

According to the program, it may be possible for the computer to function as the flash memory control apparatus.

BRIEF DESCRIPTION OF DRAWINGS

The above and other aspects, features and advantages of the present disclosure will become more apparent from the following detailed description made with reference to the accompanying drawings. In the drawings:

FIG. 9 is a diagram illustrating status combinations of individual blocks and procedures performed in the data recovery process.

DESCRIPTION OF EMBODIMENTS

Embodiments of the present disclosure will be described with reference to the drawings.

(Embodiment)

(1) Overall Configuration

Figure 1:
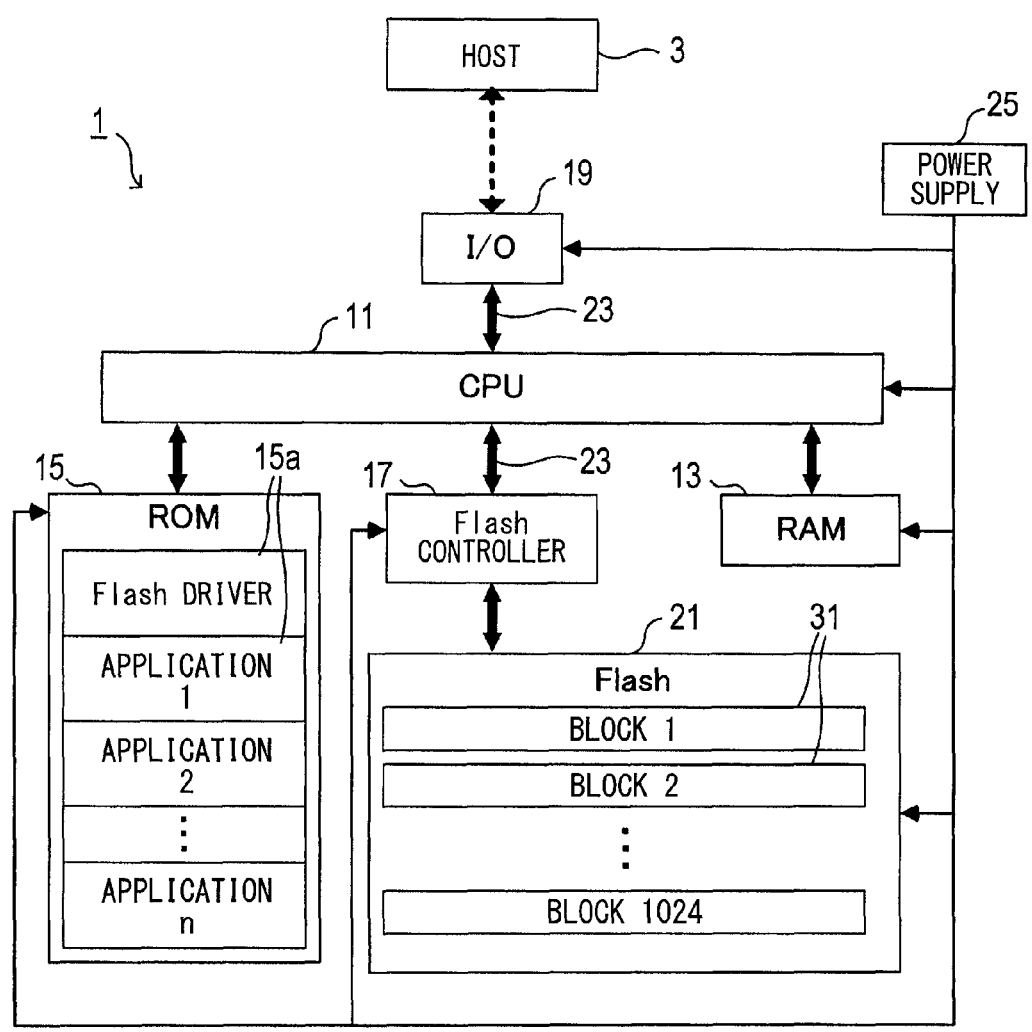
FIG. 1 is a block diagram illustrating an overall configuration of storage apparatus.

FIG. 1 is a block diagram illustrating an overall configuration of storage apparatus 1 having a flash memory. The storage apparatus 1 includes a CPU 11, a RAM 13, a ROM 15, a flash (Flash) controller 17, and input/output interface (I/O) 19, and a flash memory 21. The storage apparatus 1 transmits and receives data through an internal bus 23. A power supply 25 supplies electrical power to each of the above components.

The storage apparatus 1 configures a part of an information processing system that is mounted in a vehicle for use. In response to an access (write or read of data) request from a door ECU of a vehicle, which is an example of a host apparatus 3, the storage apparatus 1 acquires data indicative of the number of door openings/closings from the door ECU and stores the acquired data. It should be noted that various other ECUs of the vehicle may be used as the host apparatus 3. Obviously, the storage apparatus 1 may not be mounted in a vehicle for use. Various information processing apparatus other than vehicle-mounted apparatus may be used as the host apparatus 3.

The CPU 11 provides integrated control over the storage apparatus 1 in accordance with multiple programs 15a (a flash driver software program and multiple application software programs) stored in the ROM 15. In accordance with an access request from the host apparatus 3 with respect to the flash memory 21, the CPU 11 controls a data write into the flash memory 21 and a data read from the flash memory 21.

For the sake of convenience, data written into the flash memory 21 in accordance with a request from the host apparatus 3 is referred to as a write data. The write data may be read in accordance with a request from the host apparatus 3. A host apparatus which makes a request for a write may not be identical with a host apparatus which makes a request for a read.

The RAM 13 is a work area used by the CPU 11. The RAM 13 also functions as a buffer that temporarily stores write data read from the flash memory 21 and write data to be written into the flash memory 21.

The flash controller 17 performs, for example, a write process, a read process, or an erasure process with respect to the flash memory 21 based on an instruction from the CPU 11.

The flash memory 21 has 1024 blocks 31, which each represent a minimum erasure unit.

Each of the blocks 31 is relatively small block, which is formed of 32 bytes. A minimum data storage unit for additional write is 2 bytes. As the number of blocks is 1024, the total storage area is 32 kilobytes in size. Incidentally, the storage capacity and write size of the blocks 31 and the number of blocks 31 included in the flash memory 21 are not limited to the above.

Figure 2:
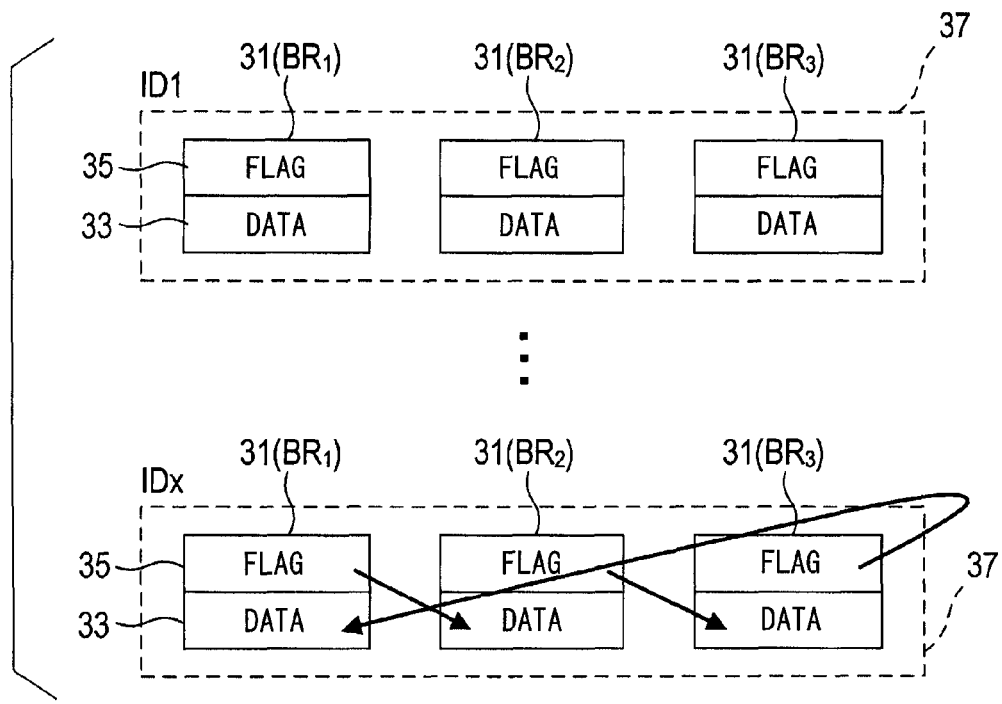
FIG. 2 is a schematic diagram illustrating how write control is exercised over a flash memory.

A method of a write control exercised over the flash memory 21 of the present embodiment will be described with reference to FIG. 2. FIG. 2 schematically illustrates the blocks 31.

The flash memory 21 includes multiple block sets 37, each of which includes three blocks 31 ($BR_1$-$BR_3$, including $BR_1$, $BR_2$ and $BR_3$). The blocks $BR_1$-$BR_3$ are so designated to identify the blocks 31 in a block set 37. The multiple block sets 37 each include blocks $BR_1$-$BR_3$.

Each block $BR_i$ (i is an integer of 1 to 3) in a block set 37 includes a data portion 33 and a flag portion 35. The data portion 33 is a storage area into which the write data can be written. The flag portion 35 is a storage area into which a write flag and an erasure-in-progress flag can be written.

The write flag indicates that writing of a write data has been performed in a target block $BR_j$ (j is an integer obtained by adding 1 to the remainder obtained by dividing i by 3) that is pre-assigned to a block $BR_i$ included in a block set 37. The erasure-in-progress flag indicates that an erasure process has been started to erase data written in the target block $BR_i$ (hereinafter may be simply referred to as a target block). The write flag and the erasure-in-progress flag may be hereinafter generically referred to as a management flag.

As regards the target block $BR_j$, j is an integer of 1 to n and is other than i. This signifies that blocks in a block set are each assigned as a target block for another block in the block set.

As a specific example of a target block, the variable j may be an integer obtained by adding 1 to the remainder obtained by dividing i+a by n. Incidentally, a is an integer of 0 to n−2. In other words, a is an integer between 0 and n−2, or is an integer not smaller than 0 and not larger than n−2.

In the present embodiment, the relationship between the blocks is explained by using variables such as i, j, k, l, m, p, and q. However, numerical values themselves are used for purposes of explanation. It is all right as far as the individual blocks are substantially explained by using the above variables.

Information about a target block $BR_j$ indicated by a management flag written in a block $BR_i$ will be described.

As indicated by arrows for a block set 37 having IDx, which is illustrated in FIG. 2, a management flag written in the flag portion 35 of a block $BR_i$ represents information about a target block $BR_j$ (in other words, the management flag written in the flag portion 35 of a block $BR_i$ monitors the status of the target block $BR_j$). The management flag indicating the information about a specific target block $BR_j$ can be written in the block $BR_i$. This scheme is planned so that sequential rotation is cyclically performed.

Figure 3:
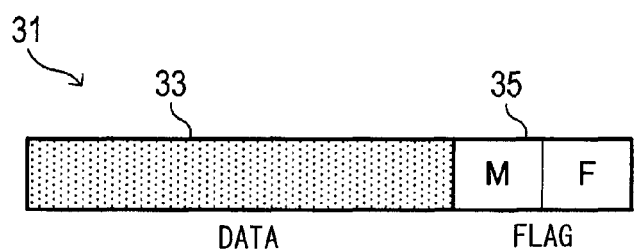
FIG. 3 is a schematic diagram illustrating a storage area of a block.

As illustrated in FIG. 3, the block 31 includes a data area as the flag portion 35 in which the write flag (F) and the erasure-in-progress flag (M) are to be written. Information about write data in a target block is indicated by a combination of the above flags (the write flag and the erasure-in-progress flag). The block 31 cannot be overwritten as a characteristic. Therefore, it is impossible to update the flags only. Each block is a minimum erasure unit. Therefore, erasing data stored in a block erases the flags as well.

The information indicated by a management flag may represent three different states: an initial state, an "erasure-in-progress" state, and a "written" state. The initial state (hereinafter may be indicated by "-") is a state where no management flag is written. The "erasure-in-progress" state is a state where a target block erasure process is started but writing of a write data is still not completed. The "written" state is a state where the writing of the write data into a target block is completed.

More specifically, when M=blank and F=blank (the term "blank" is an initial value in a state where a block erasure is performed by the flash controller 17), the "-" state prevails. In a situation where only the erasure-in-progress flag (M) is written, that is, when M=not blank and F=blank, the "erasure-in-progress" state prevails.

In a situation where the erasure-in-progress flag (M) and the write flag (F) are both written, that is, when M=not blank and F=not blank, the "written" state prevails. It should be noted that a management flag can be indicated by at least one write unit each of M and F, that is, a total of 4 bytes (2 bytes+2 bytes).

Returning to FIG. 2, an ID is given to each block set 37. Three blocks 31 included in a block set 37 are associated with the ID. In FIG. 2, for example, block sets 37 having ID1 to IDx exist. Each block set 37 includes three blocks 31.

Three blocks 31 exist in one block set 37. Therefore, three data portions 33 exist as well. The host apparatus 3 handles one block set 37 as one storage area in which write data having the same size as one block 31 can be written. Based on ID information included in a write or read request from the host apparatus 3, the CPU 11 identifies a block set 37 and then performs a writing of a write data or a reading of a write data with respect to one of the blocks 31 in the block set 37.

A conversion table (not shown) stores the relationship between identification information about each block 31 (ID information about a block set 37 to which each block 31 belongs and information for identifying each block in the block set) and the physical address of each block 31. The relationship between the identification information and the physical address may be variable depending, for instance, on the status of blocks.

(2) Process Performed by CPU 11

(2.1) Data Write Process

A sequence of a data write process performed by the CPU 11 to write data into a block set 37 will be described with reference to the flowchart of FIG. 4.

In S1, the CPU 11 determines whether an update request is generated. More specifically, when the CPU 11 receives a data write request from the host apparatus 3, that is, when a write access is made, the CPU 11 determines that an update request is generated.

In S2, the CPU 11 searches for a block set 37 that is associated with an ID (for example, IDx) of the update request generated in S1. As ID information is included in a data write request command from the host apparatus 3, the CPU 11 searches for a block set 37 having an ID indicated by the ID information. Alternatively, the command may be formed without the ID information. In such an alternative case, the CPU 11 may search for a block set having a predetermined ID on the basis of the type of a write request (the type of the host apparatus or the type of write data).

In S3, the CPU 11 identifies a block 31 that was updated earliest in the block set 37 retrieved in S2. A block updated earliest, that is, a block into which the write data was written earliest, can be identified by checking the management flags written in all the blocks 31 included in the block set 37.

Figure 5:
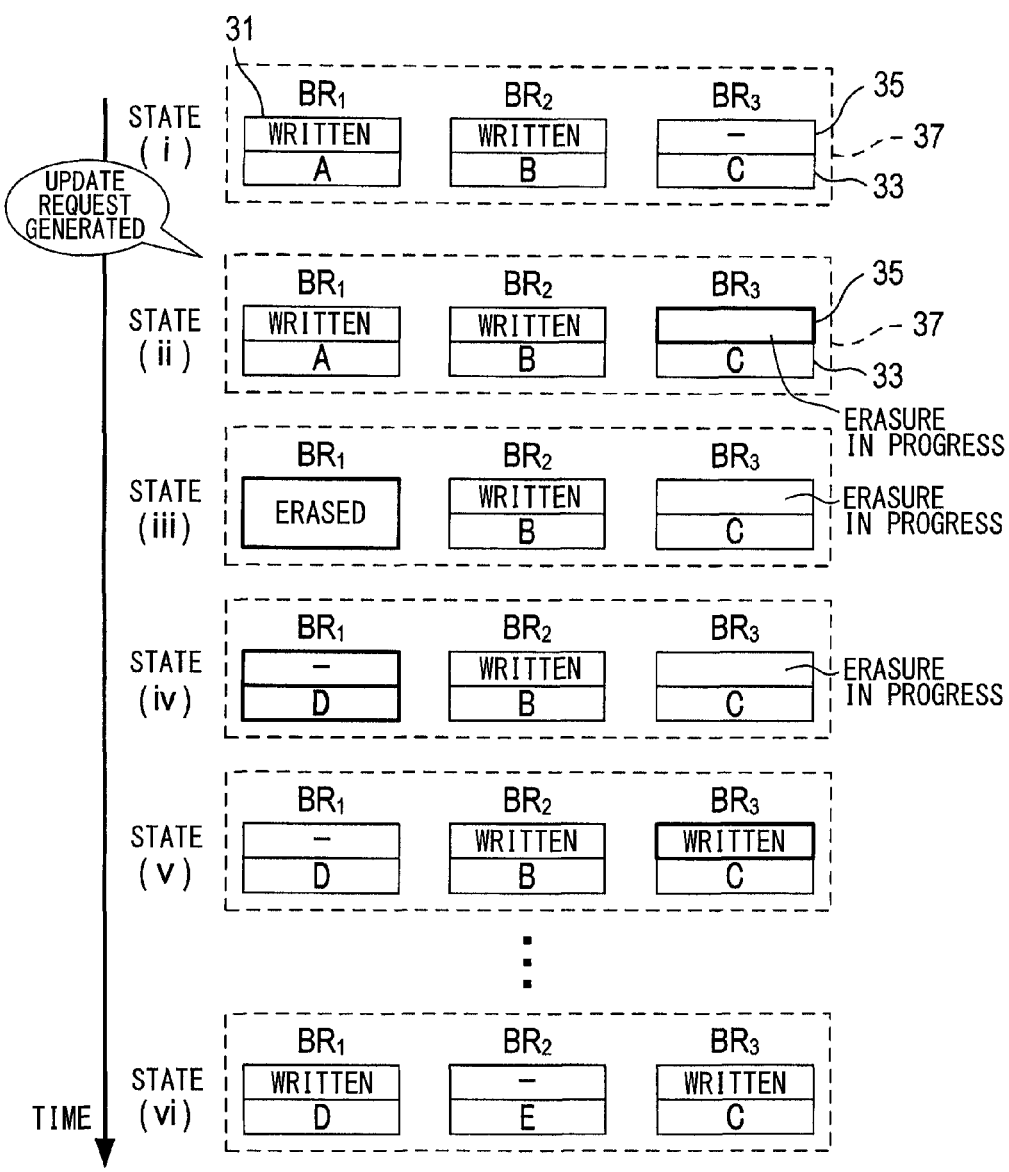
FIG. 5 is a schematic diagram illustrating a sequence of data write into a block set.
Figure 6:
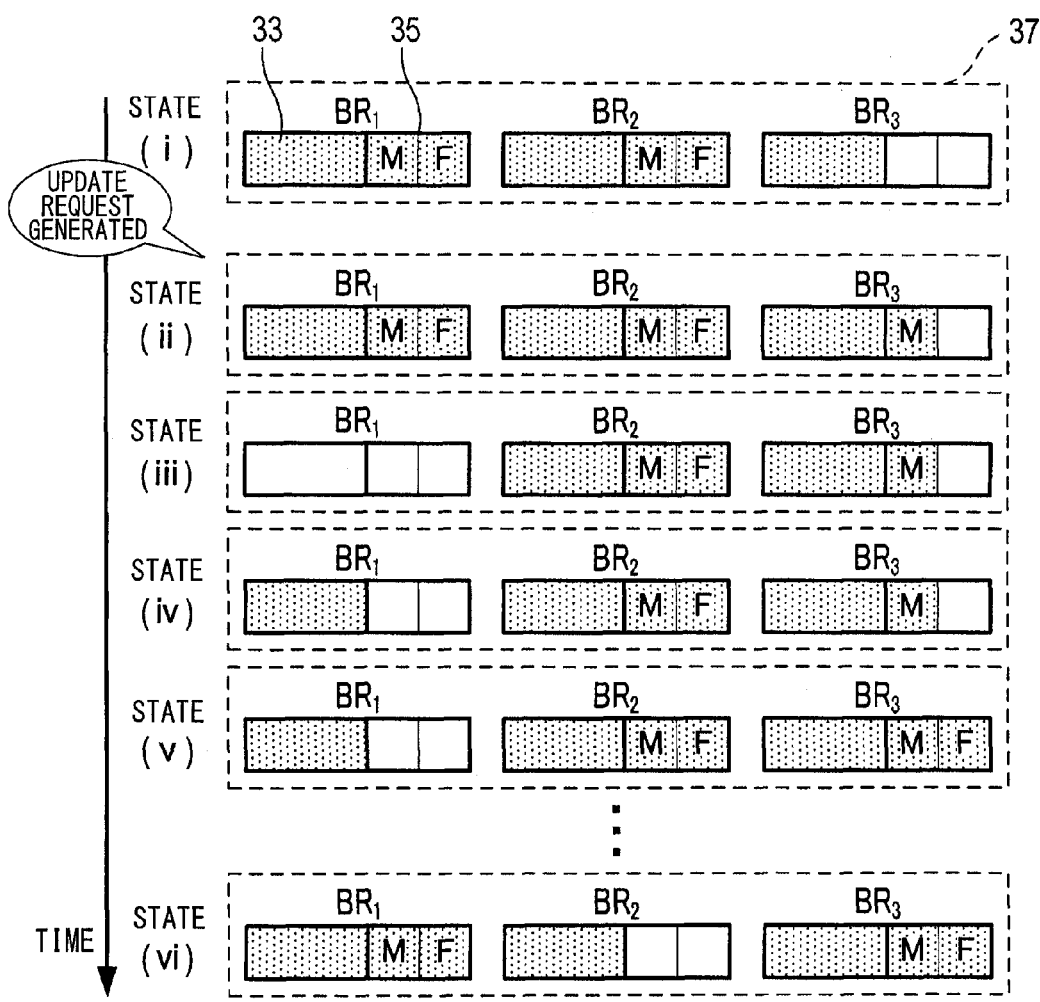
FIG. 6 is a schematic diagram illustrating a sequence of data write into a block set.

In FIGS. 5 and 6, a state (i) illustrates a normal state where no update request is generated, and states (ii) to (vi) illustrate a change with a passage of time from the state (i). Drawings designated by the same numerals (i) to (vi) in FIGS. 5 and 6 represent the same states. In the drawings, shaded portions indicate that data is present, and white portions indicate that no data is present.

In the state (i) of FIG. 5, the management flags written in the blocks $BR_1$ and $BR_2$ indicate the "written" state, and the management flag written in block $BR_3$ indicates the "-" state. A block having the management flag indicative of "-" is a block that was updated latest, that is, a block into which write data was written latest. The block $BR_1$ that is rotationally subsequent to the block $BR_3$, which was updated latest, is a block that was updated earliest (that is, a block in which a writing of write data is to be performed subsequently to the block $BR_3$). The reason why the above determination can be made will be described later.

For the sake of explanation, the following processing steps will be described with reference to the states illustrated in FIGS. 5 and 6.

In S4, the management flag written in the block $BR_3$ is updated to "erasure in progress" as indicated in the state (ii) in FIG. 5. More specifically, the erasure-in-progress flag (M) is written as indicated in the state (ii) of FIG. 6 so that M=not blank.

In S5, data stored in the block $BR_1$ is erased as indicated in a state (iii) of FIGS. 5 and 6. The block $BR_1$ is a target block for the management flag written in the block $BR_3$. As write data and a management flag are stored in the block $BR_1$, they are deleted.

In S6, data is written into the block $BR_1$. More specifically, new write data is written as indicated in a state (iv) of FIGS. 5 and 6. As no management flag is written yet, the "-" mark is indicated.

In S7, the management flag written in the block $BR_3$ is updated to "written" as indicated in a state (v) of FIG. 5. More specifically, the write flag (F) is written as indicated in the state (v) of FIG. 6, so that F=not blank.

Upon completion of the above steps, the data write process of writing data into a block set having IDx terminates. As described above, when data is erased in the state (iii), the management flag of the block $BR_1$ is placed in the initial state ("-"). This makes it possible to determine that the block having the management flag indicative of "-" is a block into which new data was written latest. Further, the block $BR_1$, the block $BR_2$, the block $BR_3$, the block $BR_1$, and so on, are rotationally written into in order named. Therefore, when the block $BR_1$ was updated latest, it can be determined that the block $BR_2$ was updated earliest.

In the next data write process, data is written into the block $BR_2$. Upon completion of the data write process, the block $BR_2$ is placed in the state (vi).

For proper data management, it is important that the process of changing the management flag to "written" in S7, namely, the writing of the write flag (F), be normally completed. Therefore, it is conceivable that a retention portion for retaining a voltage during the period of writing of the write flag (F) may be incorporated. For example, a capacitor may be used as the retention portion. Alternatively, however, a different device may be used for voltage retention purposes.

When, for example, no management flag exists in any block 31 in a block set 37 after the flash memory 21 is initialized, data in a block 31 is erased to write a write data in any one of the blocks 31. In addition, a management flag indicative of "written" is written in another block 31. This ensures that only the block 31 in which the write data is written becomes a block having a management flag indicative of "-". Therefore, the above-described write process can be performed when the next write request is generated.

(2.2) Data Recovery Process

Figure 7:
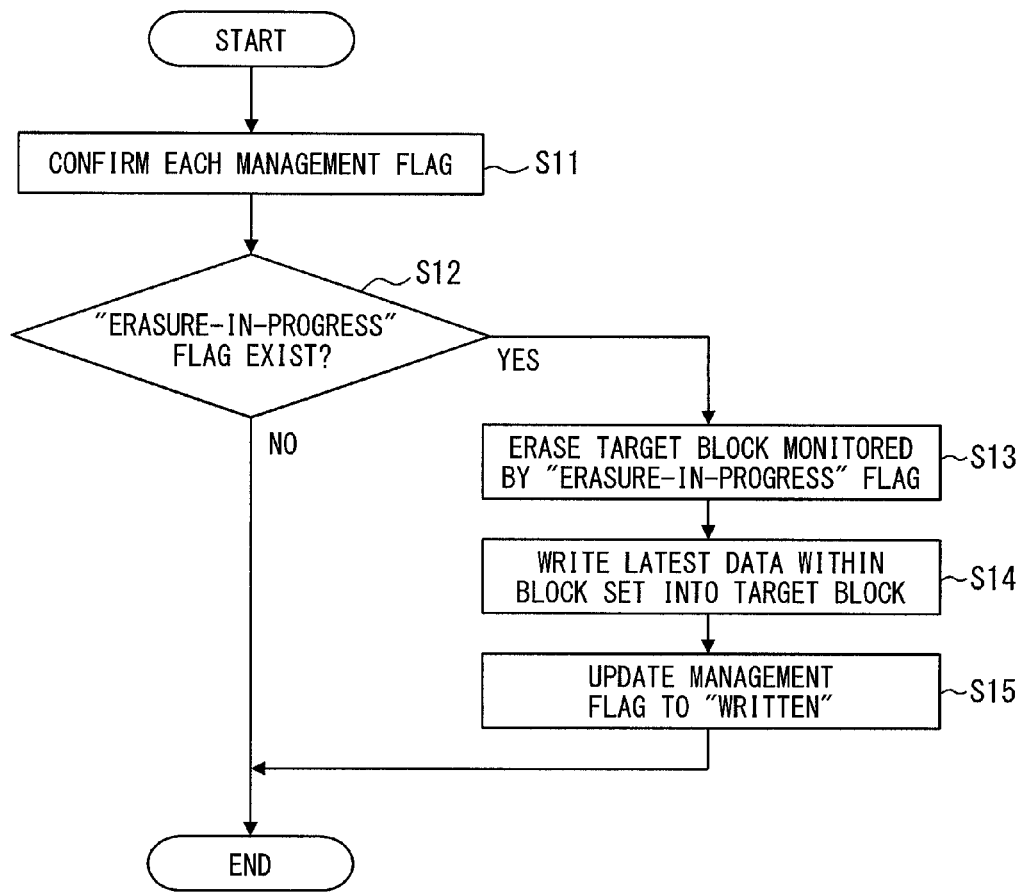
FIG. 7 is a flowchart illustrating a sequence of a data recovery process.

A sequence of a data recovery process performed by the CPU 11 will be described with reference to the flowchart of FIG. 7. The data recovery process starts at a time when recovery from power loss is achieved, that is, at a time when power is turned back on to start the apparatus and permit the CPU 11 to perform the data recovery process.

In S11, the CPU 11 confirms each of the management flags of the blocks 31 in the block sets 37 associated with all IDs.

In S12, it is determined whether a management flag indicative of "erasure in progress" exists or not, based on the result of confirmation in S11. As mentioned above, the management flag indicates "erasure in progress" a case when the erasure-in-progress flag (M)=not blank and the write flag (F)=blank. That is, S12 detects a block (a block indicative of erasure-in-progress) in which the write flag is not written but the erasure-in-progress flag is written. When no such management flag exists (S12: NO), that is, no block indicative of erasure-in-progress is detected, the data recovery process terminates without performing any further processing step since it is conceivable that all the block sets 37 are in a normal state.

Figure 8A:
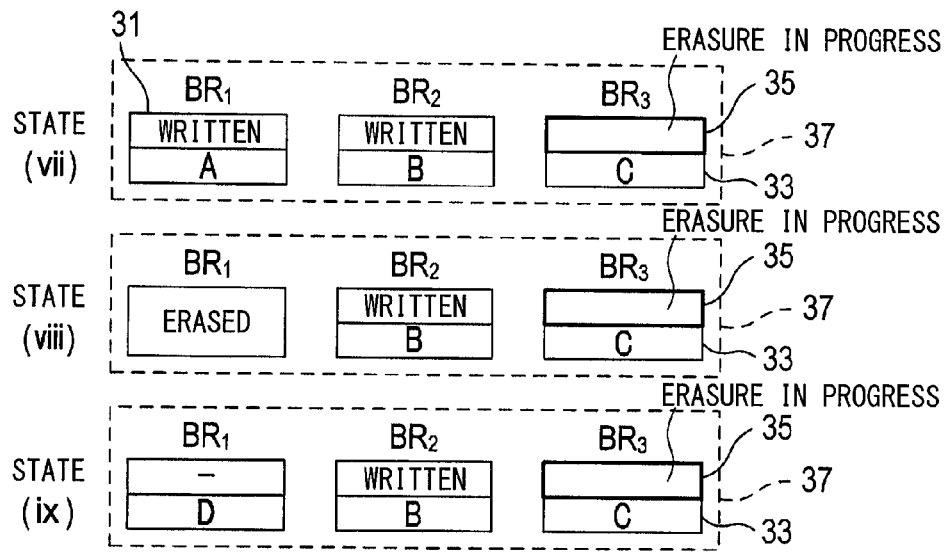
FIG. 8A is a schematic diagram illustrating a sequence of data recovery in a block set.

When, by contrast, a management flag indicative of "erasure in progress" exists in S12 (S12: YES), that is, when the block indicative of erasure-in-progress is detected, S13 and beyond are performed since it is considered that a data write process is interrupted in a state (vii) to a state (ix) of FIG. 8A. The state (vii) to the state (ix) of FIG. 8A are in the same management flag status as the state (ii) to the state (iv) of FIG. 5.

For the sake of explanation, the following processing steps will be described with reference to the states illustrated in FIGS. 8A and 8B.

Figure 8B:
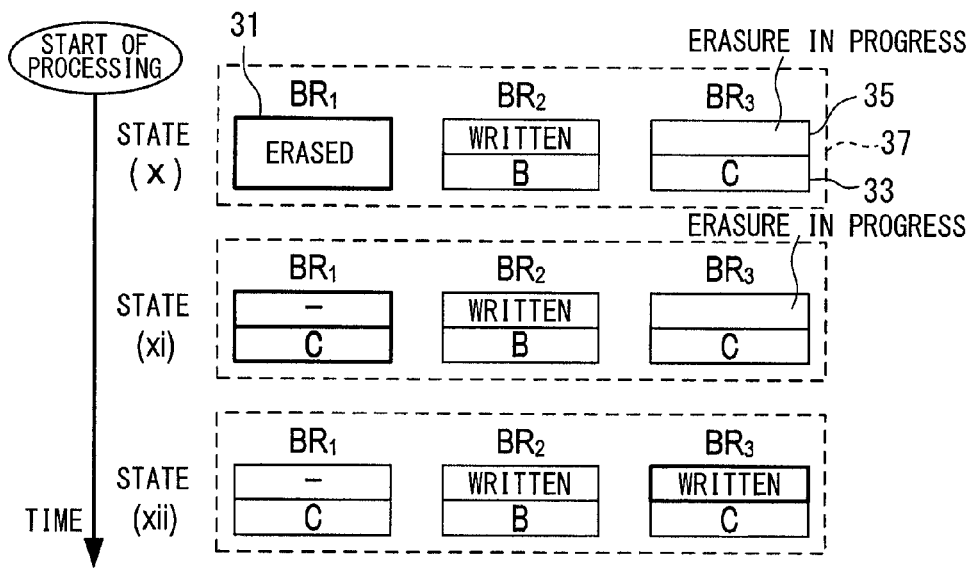
FIG. 8B is a schematic diagram illustrating a sequence of data recovery in a block set.

In S13, data in a target block $BR_1$ is erased as illustrated in a state (x) of FIG. 8B. The target block $BR_1$ is monitored by a management flag that is written in a block $BR_3$ and indicative of "erasure in progress".

In S14, data recovery is achieved as illustrated in a state (xi) of FIG. 8B. The data recovery is achieved by writing latest data of the block set 37 in the target block $BR_1$ from which the data was erased in S13. Incidentally, the latest data is the write data that is written in the block $BR_3$ in which the management flag indicative of "erasure in progress" is written.

In S15, the management flag written in the block $BR_3$ is updated to "written" as illustrated in a state (xii) of FIG. 8B. More specifically, the write flag (F) is written in the block $BR_3$. The data recovery process then terminates.

Meanwhile, when it is determined in S12 that the management flag indicative of "erasure in progress" exists, such a situation is not limited to cases illustrated in FIGS. 8A and 8B, but may be represented by a table shown in FIG. 9. As regards the combinations of states indicated in the table of FIG. 9, F represents the "written" state where the write flag (F) and the erasure-in-progress flag (M) are both written, and M represents the "erasure in progress" state where only the erasure-in-progress flag is (M) is written.

In state numbers 1, 5, and 9, which are normal states, the data recovery process is not performed. In the other states, that is, in states where M exists, S13 to S15 are performed to recover write data.

In state numbers 3, 7, and 11, two Ms exist. As illustrated in FIGS. 5 and 6, a state where two management flags indicative of "erasure in progress" exist cannot possibly arise from an expected sequence. However, when power is shut off while a block 31 is being erased, data becomes unstable so that an M state may accidentally arise when, for example, only the write flag (M) is deleted. Therefore, a state where two Ms exist is also indicated in the table.

(2.3) Data Read Process

When a data read request is received from the host apparatus 3, that is, when a read access is made, the CPU 11 checks the management flags written in all the blocks 31 in a block set 37 designated by the data read request, and detects a block in which the write flag is not written and the management flag indicates the "-" state. The CPU 11 then reads write data written in the detected block and outputs the read write data to the host apparatus 3.

Here, the host apparatus 3 may be a computer system that acquires vehicle information, for example, from the storage apparatus 1. Namely, the host apparatus 3 issuing a write request of a write data to the storage apparatus 1 may not be identical with the host apparatus 3 issuing a write data read request with respect to the write data written in the flash memory 21 of the storage apparatus 1.

(3) Advantages

The storage apparatus 1 according to the present embodiment includes the flash memory 21 having multiple blocks 31 in which erasure of data is performed in units of a block and writing of data is performed in units smaller than the block. The CPU 11 (corresponding to an example of a control portion) controls the flash controller 17 so as to read data written in the blocks 31 and write data into the blocks 31.

At least one block set 37 is set in the flash memory 21. The block set 37 includes n blocks $BR_1$ to $BR_n$ (n=3, in the present embodiment). More specifically, the CPU 11 (corresponding to an example of a setup portion) sets the individual blocks 31 as a block set 37 on the basis of the conversion table indicative of the relationship between the identification information about each block 31 and the physical address of each block 31.

Write data, which is the data to be written in accordance with a request from the host apparatus 3, and the write flag, which indicates that the write data is written in the target block $BR_j$ (j is an integer obtained by adding 1 to the remainder obtained by dividing i by n), can be written into the blocks $BR_i$ (i is an integer of 1 to n) included in the block set 37.

In accordance with a write request of a new write data from the host apparatus 3, the CPU 11 performs an erasure process (S5), a first write process (S6), and a second write process (S7). The erasure process (S5) is performed to erase data including write data and write flag written in a block $BR_l$ (l is an integer of 1 to n) that is set as the block into which write data is to be written subsequently to a block $BR_k$ (k is an integer of 1 to n), which is a block 31 in which write data was written latest among the blocks included in the block set 37. The first write process (S6) is performed to write new write data into the block $BR_l$. The second write process (S7) is performed to write a write flag into a block $BR_m$ for which the block $BR_l$ is assigned as a target block.

In the present embodiment, the variable l of the block $BR_l$ is, more specifically, an integer obtained by adding 1 to the remainder obtained by dividing k by n.

The block $BR_m$ is a block for which the aforementioned "block to be written into next" is assigned as a target block.

When writing new write data into the block set 37, the storage apparatus 1 according to the present embodiment erases data written in a block 31 that was written into earliest among the blocks included in the block set 37, and writes the new write data into that block 31.

Thus, in comparison with a conventional storage apparatus that needs to perform a copy process of copying data to another block during a reorganization process, the storage apparatus 1 does not have to perform the copy process during the reorganization process. It may be possible to suppress a processing load increase due to the reorganization process, that is, suppress the occurrence of overhead. It may be possible to suppress degradation in overall system performance and delay in response to data access, which are caused by the occurrence of overhead.

Which block is to be erased or written into can be confirmed by checking the management flags of blocks included in the block set 37. In the present embodiment, a block rotationally subsequent to a block in which no management flag is written is to be erased and written into.

In accordance with a data read request from the host apparatus 3, the CPU 11 performs a read process of reading write data written in a block $BR_k$ in which write data was written latest. Therefore, it may be possible to output the latest data to the host apparatus 3.

The storage apparatus 1 according to the present embodiment is capable of writing the erasure-in-progress flag in each of the blocks $BR_i$ included in the block set 37 in order to indicate that the erasure process is started with respect to the target block $BR_j$.

When an erasure process is started with respect to the block $BR_l$ in accordance with a write request of a new write data from the host apparatus 3, the CPU 11 performs a third write process (S4) of writing the erasure-in-progress flag in the block $BR_m$, performs the erasure process (S5) with respect to the block $BR_l$ after the third write process, performs a first write process (S6) with respect to the block $BR_l$ after the erasure process, and performs a second write process (S7) with respect to the block $BR_m$ after the first write process.

Thus, it may be possible for the storage apparatus 1 according to the present embodiment to recognize the progress of a process performed in accordance with a write request from the host apparatus by checking the erasure-in-progress flag and the write flag. More specifically, when only the erasure-in-progress flag is written, it may be possible to determine that a write process is in progress, and when the erasure-in-progress flag and the write flag are both written, it may be possible to determine that a write process is completed.

When it is determined, while no write process is being performed, that a write process is in progress, it may be possible that a write process may not be properly completed. In such an instance, it may be possible to determine the presence of possibly abnormal data by detecting a block in which a write process is not properly completed.

When power is turned back on, the CPU 11 (corresponding to an example of a detection portion) in the storage apparatus 1 according to the present embodiment detects a block 31 (corresponding to an example of a block indicative of erasure-in-process) in which the write flag is not written but the erasure-in-progress flag is written (S11, S12).

When the block 31 that is the block indicative of erasure-in-process is detected and the detected block is assumed to be a block $BR_p$ (p is an integer of 1 to 3), the CPU 11 performs a process (S13) of erasing data including write data, write flag, and erasure-in-progress flag written in a block $BR_q$, which is a target block for the block $BR_p$, writes write data, which is written in a block that is included in a block set and is other than the block $BR_q$, into the block $BR_q$ (S14), and performs a second write process (S15) with respect to the block $BR_p$. In the present embodiment, the write data written in the block indicative of erasure-in-process, that is, the latest write data, is written into the block $BR_q$ in S14.

When power is turned back on, the storage apparatus 1 according to the present embodiment determines whether a block whose management flag indicates "erasure in progress" exists. When such a block exists, the storage apparatus 1 moves write data written in a block in which the management flag indicative of "erasure in progress" is written to a target block. Accordingly, even when a write process is interrupted due to power loss, it may be possible to prevent the write data itself from being lost although new write data being written by the interrupted write process cannot be acquired.

Further, as the above described process is performed when power is turned back on, the possibility of abnormal data being used is low. This provides increased convenience.

In S14, write data written in a block other than the block $BR_q$ (a block indicative of erasure-in-progress) may be written in the block $BR_q$. However, when the write data written in the block $BR_p$ is used as mentioned above, it may be possible to recover write data written later in the block $BR_q$.

(Other Embodiments)

While an embodiment of the present disclosure has been described above, the present disclosure is not limited to the above-described embodiment. The present disclosure may be implemented in various other embodiments as far as they fall within the technical scope of the present disclosure.

In the embodiment, a configuration that the block set 37 includes three blocks 31 is exemplified. The block set may include two or more blocks, and the number of blocks included in the block set is not limited to three.

When the block set 37 includes two blocks 31, the interruption of a write process is detected with lower accuracy than when the block set 37 includes three or more blocks 31. The reason will be described below.

Figure 4:
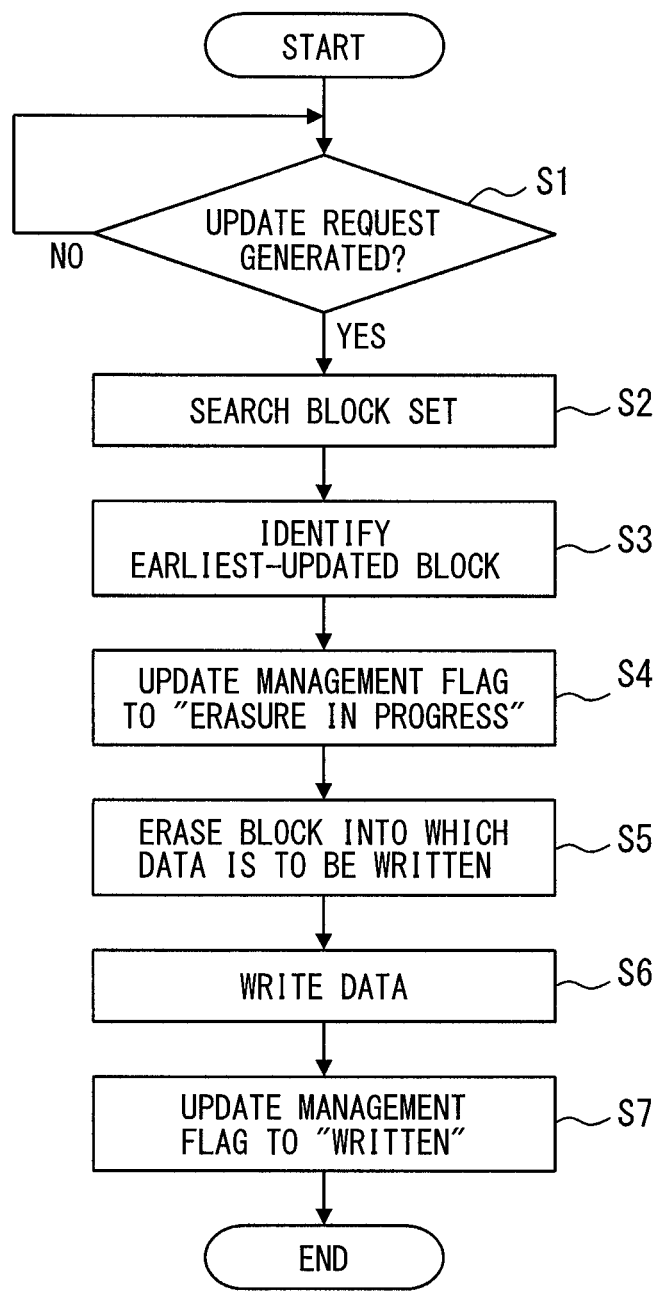
FIG. 4 is a flowchart illustrating a sequence of a data write process.

When the erasure process performed for the target block $BR_l$ in S5 is interrupted due, for instance, to power loss after the management flag of the block $BR_k$ is updated to "erasure in progress" in S4 of FIG. 4, only the write flag (F) of the block $BR_l$ may be erased without erasing the erasure-in-progress flag (M). In such an instance, the management flag written in the block $BR_l$ indicates "erasure in progress".

When the block set 37 includes two blocks 31 in the above instance, the management flags written in the two blocks both indicate "erasure in progress". Thus, it is difficult to determine which block has normal data.

When the block set 37 includes three or more blocks 31, the management flag of at least one bock 31 indicates "written". Thus, a block whose management flag changes from "written" to "erasure in progress" when the blocks are checked in a rotational sequence can be determined to be a block that stores latest data obtained before an interrupted write process.

In the above-described embodiment, it is assumed that a write flag to be written in the blocks $BR_i$ included in a block set 37 indicates that a writing of write data is performed in a target block $BR_j$ (j is an integer obtained by adding 1 to the remainder obtained by dividing i by n).

However, the target block $BR_j$ is not restricted by the above rule. Alternatively, j may be an integer of 1 to n, is other than i, and varies with the value i. When this scheme is employed, each of the blocks included in the block set is assigned as a target block for another block included in the block set. This makes it possible to determine the write status of each block.

As regards the target block $BR_j$, j may be an integer that is obtained by adding 1 to the remainder obtained by dividing i+a by n. Here, a is an integer of 0 to n−2. In the above-described embodiment, a=0. A method of providing write control over a flash memory when a=1 will be described with reference to FIG. 10.

The flash memory includes multiple block sets 37a, which each include five blocks 31a ($BR_1$ to $BR_5$). Each block includes a data portion 33a and a flag portion 35a.

Figure 10:
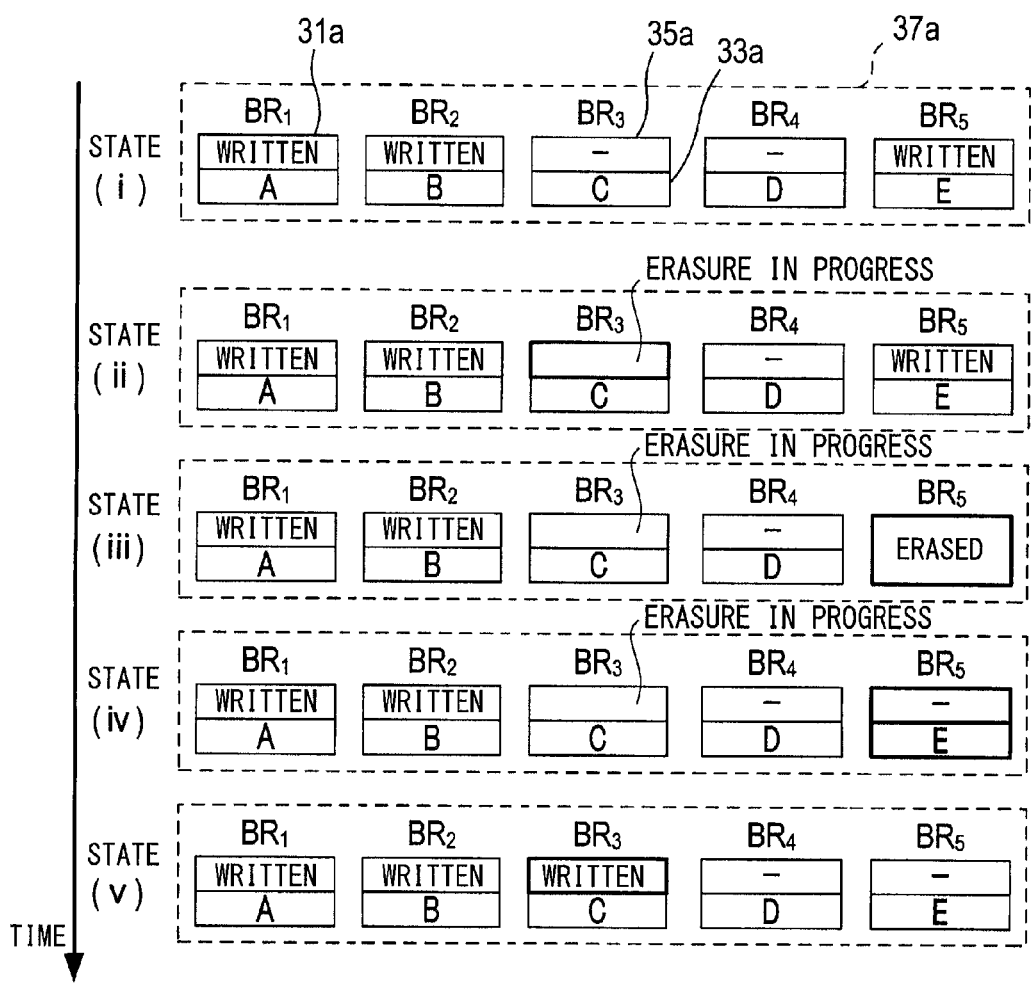
FIG. 10 is a schematic diagram illustrating a sequence of data write into a block set in a modified example.

In a state (i) of FIG. 10, the management flags written in the block $BR_3$ and the block $BR_4$ indicate "-". The next data write is to be performed in the block $BR_5$. A block for which the block $BR_5$ is assigned as a target block, that is, a block into which a management flag monitoring the block $BR_5$ is to be written, is the block $BR_3$. The latest write was performed in the block $BR_4$.

When a write is to be performed, the management flag written in the block $BR_3$ is first updated to "erasure in progress as indicated in a state (ii). Next, data stored in the block $BR_5$ is erased as indicated in a state (iii). The block $BR_5$ is a target block for the management flag written in the block $BR_3$. Subsequently, new write data is written as indicated in a state (iv). As the management flag is not yet written, the "-" state is indicated.

The management flag written in the block $BR_3$ is then updated to "written" as indicated in a state (v). Upon completion of the above steps, the data write process on the block set terminates. In the state (v), the next data write is to be performed in the block $BR_1$, a block for which the block $BR_1$ is assigned as a target block is the block $BR_4$, and the latest write was performed in the block $BR_5$.

When, as described above, the target block $BR_j$ is such that j is an integer obtained by adding 1 to the remainder obtained by dividing i+a by n, a write can be sequentially performed in the blocks included in the block set.

In the above-described embodiment, the completion of a data write is determined by using the erasure-in-progress flag and the write flag. The data recovery process is performed when the data write is not completed. Alternatively, the erasure-in-progress flag may not be used and the data recovery process may not be performed. When such an alternative is adopted, a point of time at which write data is written in the block $BR_l$ may be either earlier or later than a point of time at which the write flag is written in the block $BR_m$.

In the above-described embodiment, the CPU 11 checks for a block whose management flag indicates "erasure in progress" at a time at which power is turned back on. However, such a check may not be performed at a time at which power is turned back on, but may be performed at various other times. A management flag indicative of "erasure in progress" is generated during the time interval between the instant at which the third write process (S4) starts and the instant at which the second write process (S7) terminates even when a write process is not interrupted. Therefore, it is conceivable that the above-mentioned check may be performed at a time that is outside the above time interval.

In the above-described embodiment, the number n of blocks included in a block set 37 may vary from one block set 37 to another. For example, a block set 37 associated with ID1 may be configured so that n=3, and a block set 37 associated with ID2 may be configured so that n=5.

Further, the block sets need not be similar to each other in the relationship between, for example, $BR_i$, $BR_j$, and $BR_k$. The block sets may differ from each other in such a relationship. For example, the block set 37 associated with ID1 and the block set 37 associated with ID2 may be both configured so that n=5, write control may be exercised over the block set 37 associated with ID1 so that the variable a=1 as indicated in FIG. 10, and write control may be exercised over the block set 37 associated with ID2 so that the variable a=0.

The host apparatus 3 does not need to exist outside the storage apparatus 1. Alternatively, the host apparatus 3 may be included in the storage apparatus 1. Further, the storage apparatus 1 may function as the host apparatus. More specifically, the CPU 11 may perform a process unrelated to the control of the flash memory 21 to acquire or generate write data and write the write data into the flash memory 21, or may read written write data and use the read data for another process.

The above-described functions incorporated in the storage apparatus 1 may be implemented by flash memory control apparatus that includes the CPU 11, the RAM 13, the ROM 15, the flash controller 17, and the input/output interface (I/O) 19.

The above-described functions incorporated in the storage apparatus 1 may be implemented by a computer that is operated by a program.

The program is formed of a sequence of instructions suitable for computer processing. The program may be stored, for instance, in a ROM or RAM built in the computer and loaded into the computer for use, or may be loaded into the computer through various storing media or a communication line for use.

For example, a CD-ROM, a DVD-ROM, or other optical disk, a magnetic disc, and a semiconductor memory may be used as the aforementioned storing media that loads the program into the computer.

It is noted that a flowchart or the processing of the flowchart in the present application includes multiple steps (also referred to as sections), each of which is represented, for instance, as S1. Further, each step can be divided into several sub-steps while several steps can be combined into a single step.

While various embodiments, configurations, and aspects of storage apparatus, a flash memory control apparatus, and a program have been exemplified, the embodiments, configurations, and aspects of the present disclosure are not limited to those described above. For example, embodiments, configurations, and aspects obtained from an appropriate combination of technical elements disclosed in different embodiments, configurations, and aspects are also included within the scope of the embodiments, configurations, and aspects according to the present disclosure.

What is claimed is:

1. A storage apparatus comprising:
   a flash memory that includes a plurality of blocks, an erasure of a data being performed in units of a block, a writing of a data being performed in units smaller than the block; and
   a control portion that reads the data written in the block and writes the data into the block;
   wherein:
   the flash memory includes at least one block set having n pieces of the blocks including $BR_1$ to $BR_n$, n being an integer of 2 or more;
   a write data and a write flag are capable of being written into each of blocks $BR_i$ included in the block set, i being an integer of 1 to n, the write data being written in accordance with a request from a host apparatus, the write flag indicating that the write data has been written into a target block $BR_j$ that is pre-assigned to each of the blocks $BR_i$ of the block set, j being an integer of 1 to n and other than i and varying with respect to a value of i; and
   in accordance with a write request of a new write data from the host apparatus, the control portion performs an erasure process, a first write process, and a second write process, the erasure process erasing the data including the write data and the write flag written in a block $BR_l$, l being an integer of 1 to n, the block $BR_l$ being set as the block into which a write data is to be written subsequently to a block $BR_k$, k being an integer of 1 to n, the block $BR_k$ being the block in which the write data has been written latest among the blocks included in the block set, the first write process writing the new write data into the block $BR_l$, the second write process writing the write flag into a block $BR_m$ for which the block $BR_l$ is assigned as the target block.

2. The storage apparatus according to claim 1, wherein:
   in accordance with a data read request from the host apparatus, the control portion reads the write data written in a block in which the write data has been written latest, in the block set.

3. The storage apparatus according to claim 1, wherein:
   an erasure-in-progress flag is capable of being written into each of the blocks $BR_i$ included in the block set in order to indicate that the erasure process is started with respect to the target block $BR_j$; and
   when the erasure process is started with respect to the block $BR_l$ in accordance with a write request of a new write data from the host apparatus, the control portion performs a third write process to write the erasure-in-progress flag into the block $BR_m$, performs the erasure process with respect to the block $BR_l$ after the third write process, performs the first write process with respect to the block $BR_l$ after the erasure process, and performs the second write process with respect to the block $BR_m$ after the first write process.

4. The storage apparatus according to claim 3, further comprising:
   a detection portion that detects a block indicative of erasure-in-progress at a predetermined time excluding a time interval between an instant at which the third write process starts and an instant at which the second write process terminates, the block indicative of erasure-in-progress being the block in which the write flag is not written and the erasure-in-progress flag is written;
   when the detection portion detects the block, a detected block is assumed to be a block $BR_p$, p being an integer of 1 to n, the control portion erases a data including the write data and the write flag written in a block $BR_q$ that is the target block for the block $BR_p$, the control portion writes the write data, which is written in any one of the blocks in the block set and is other than the block $BR_q$, into the block $BR_q$ after an erasure of the data, and the control portion writes the write flag into the block $BR_p$.

5. A flash memory control apparatus comprising:
   a control portion that reads a data written in and writes a data into a block of a plurality of blocks included in a flash memory, an erasure of the data being performed in units of a block, a writing of the data being performed in units smaller than the block; and
   a setup portion that includes at least one block set having n pieces of the blocks $BR_1$ to $BR_n$ included in the flash memory, n being an integer of 2 or more,
   wherein:
   the control portion performs a first write process and a second write process, the first write process writing a write data that is to be written into a block $BR_i$ included in the block set in accordance with a request from a host apparatus, i being an integer of 1 to n, the second write process writing a write flag in order to indicate to the block $BR_i$ that a writing of the write data has been performed in a target block $BR_j$ that is pre-assigned to the block $BR_i$ included in the block set, j being an integer of 1 to n and other than i and varies with a value of i; and
   in accordance with a write request of a new write data from the host apparatus, the control portion performs an erasure process, the first write process, and the second write process, the erasure process erasing the data including the write data and the write flag written in a block $BR_l$, l being an integer of 1 to n, the block $BR_l$ being set as a block into which the write data is to be written subsequently to a block $BR_k$, k being an integer of 1 to n, the block $BR_k$ being a block in which the write data has been written latest among the blocks included in the block set, the first write process being performed with respect to the block $BR_l$, the second write process being performed with respect to a block $BR_m$ for which the block $BR_l$ is assigned as the target block.

6. A non-transitory computer-readable storage medium that stores a program causing a computer to function as the control portion and the setup portion of the flash memory control apparatus according to claim 5.

\* \* \* \* \*